United States Patent [19]
Riley et al.

[11] Patent Number: 5,949,986
[45] Date of Patent: Sep. 7, 1999

[54] CHIP CONNECTIVITY VERIFICATION PROGRAM

[75] Inventors: Josh Riley, Pasadena; George Patterson, San Francisco, both of Calif.

[73] Assignee: California Institute of Technology, Pasadena, Calif.

[21] Appl. No.: 08/707,649

[22] Filed: Sep. 5, 1996

[51] Int. Cl.[6] .............................. G06F 17/50; G06F 19/00; G01R 33/16

[52] U.S. Cl. .............................. 395/500.03; 364/468.17; 702/58; 324/210; 324/512

[58] Field of Search ..................................... 364/488–491, 364/578, 468.15–468.17; 702/58, 81, 117; 324/200, 207.21, 500, 512, 210, 754, 538, 693, 765, 550

[56] References Cited

U.S. PATENT DOCUMENTS

| | | | |
|---|---|---|---|
| 4,565,966 | 1/1986 | Burr et al. | 324/73 PC |
| 4,801,869 | 1/1989 | Sprogis | 324/73 R |
| 4,967,381 | 10/1990 | Lane et al. | 364/551.01 |
| 5,034,685 | 7/1991 | Leedy | 324/158 F |
| 5,086,477 | 2/1992 | Yu et al. | 382/8 |
| 5,483,461 | 1/1996 | Lee et al. | 364/490 |
| 5,561,367 | 10/1996 | Goettling et al. | 324/158.1 |
| 5,612,626 | 3/1997 | Golladay | 324/751 |
| 5,655,110 | 8/1997 | Krivokapie et al. | 395/500 |
| 5,699,282 | 12/1997 | Allen et al. | 364/571.01 |
| 5,838,161 | 11/1998 | Akram et al. | 324/755 |

OTHER PUBLICATIONS

Mead and Conway, *Introduction to VLSI Systems*, Addison-Wesley Publishing Company, Oct. 1980.

*Primary Examiner*—Kevin J. Teska
*Assistant Examiner*—Phallaka Kik
*Attorney, Agent, or Firm*—Fish & Richardson P.C.

[57] ABSTRACT

A method for testing electrical connectivity between conductive structures on a chip that is preferably layered with conductive and nonconductive layers. The method includes determining the layer on which each structure is located and defining the perimeter of each structure. Conductive layer connections between each of the layers are determined, and, for each structure, the points of intersection between the perimeter of that structure and the perimeter of each other structure on the chip are also determined. Finally, electrical connections between the structures are determined using the points of intersection and the conductive layer connections.

19 Claims, 11 Drawing Sheets

| | 282 | 283 | 284 |
|---|---|---|---|
| Ex: W=10 | 0,0 | 20,20 | 40,0 |

θ = (Angle1 + Angle2)/2
θ = (225° + 315°)/2
θ = 270°

∇x = cos(θ∗π/180) ∗ h
∇x = cos(270∗3.14159/180) ∗ 7.1
∇x = 0

∇y = sin(θ∗π/180) ∗ h
∇y = sin(270∗3.14159/180) ∗ 7.1
∇y = 7.1

β = θ ∗ Angle1
β = 270° - 225°
β = 45° h = |(width/2)/sin(β∗π/180)|
h = |(10/2)/(45∗3.14159/180)|
h = 7.1

CHIP CONNECTIVITY VERIFICATION PROGRAM

STATEMENT AS TO FEDERALLY SPONSORED RESEARCH

The invention described herein was made in the performance of work under a NASA contract and is subject to the provisions of Public Law 96-517 (35 U.S.C. §202), in which the Contractor has elected to retain title.

BACKGROUND OF THE INVENTION

1. Field of the Invention

This invention relates to a method for testing electrical connectivity on a chip. More particularly, this invention relates to a method for testing electrical connectivity between conductive structures on a chip that has no active electrical devices.

2. Background and Summary

Integrated circuit chips generally include layers of conductive and nonconductive materials, sandwiched together. The chips generally have a number of probes or connectors that connect the chip to external devices. Each layer may include many elements, including active electrical devices (such as transistors), capacitors, inductors, conductive wire runs, conductive vias through the layer, and the like. Combinations of these elements may be interconnected to electrically connect various probes to one another.

Integrated circuit chips must be tested for design flaws before production. For example, electrical connections between various probes on a chip must be tested to determine if any unwanted short or open circuits exist between the probes.

Thus, methods have been developed for testing electrical connectivity on integrated circuit chips. Computerized testing methods exist for chips with layers that include active electrical devices, capacitors, and inductors.

Chips have recently been developed, however, that have no active electrical devices and no capacitors or inductors. These chips, known generally as Magnetic Memory Design ("MMD") chips, are presently used for data storage. An MMD chip, like conventional chips, has probe pads that connect the MMD chip to external devices. The probe pads are interconnected by a network of conductive structures, including polygonal structures and wire runs, which are located on stacked conductive layers. The conductive layers are generally separated by nonconductive (or insulating) layers.

Conventional MMD chips are not highly complex. They have only a few layers and a few conductive structures on each layer. As a result, the electrical connectivity between probe pads and other conductive structures on conventional MMD chips has been tested by hand, with little risk of error.

Recently, however, highly-complex MMD chips have been developed that have many conductive layers, many small conductive structures formed on those layers, and many probe pads. Consequently, conventional hand-testing for electrical connectivity is unreliable, impractical, and uneconomical for these new MMD chips. In addition, computerized methods for testing chips that have active electrical devices, capacitors, and/or inductors do not work for MMD chips. Those methods rely on the existence of at least some active electrical devices, capacitors, and/or inductors on the chip. The absence of such devices on MMD chips causes conventional computerized testing methods to register short circuits between electrically connected probe pads and other conductive structures.

Accordingly, the inventors recognized the need for a method to test the electrical connectivity on chips that have no active electrical devices and/or no capacitors or inductors.

It is an object of the present invention to provide a method for testing and verifying electrical connections between conductive structures on a chip consisting of a network of conductive structures.

It is a further object of the present invention to provide a method for constructing a linked path of conductive structures between probe pads on a chip with no active electrical devices and/or no capacitors or inductors.

It is yet another object of the present invention to test the designs of a chip having no active electrical devices and no capacitors or inductors to ensure that probe pads are correctly linked on each layer and between layers of the chip.

In accordance with the present invention, a method is provided for determining electrical connectivity on a chip. The method includes providing a chip devoid of active electrical devices and devoid of capacitors and inductors and having multiple layers and multiple conductive structures. The method further includes determining the layer on which each conductive structure is located, determining whether any conductive layer connections exist between the plurality of layers, and determining which conductive structures are electrically connected.

Another embodiment of the present invention is a method for testing electrical connections between conductive structures on a chip having multiple layers. The conductive structures include polygonal conductive structures, each of which is located on a known layer. The method includes determining, for each polygonal conductive structure, a set of line segments defining its perimeter. The method further includes determining conductive layer connections between each of the layers, and determining, for each polygonal conductive structure, points of intersection between the set of line segments defining the perimeter of that structure and the set of line segments of all other structures on the chip. The method also includes testing electrical connections between conductive structures using the conductive layer connections and the points of intersection.

Another embodiment of the present invention is a method for finding electrical short circuits on a microchip having electrically interconnected conductive structures. Each conductive structure has a perimeter, and the microchip has multiple layers. The conductive structures include vias between at least some of the layers. The method includes determining a set of vertices along the perimeter of each conductive structure. The method further includes determining, for each conductive structure, a set of line segments connecting its vertices and thereby defining its perimeter. The method also includes determining points of intersection between the set of line segments for each conductive structure to locate overlapping conductive structures, and locating the vias by determining the conductive structures, if any, that are contained within the set of line segments of another conductive structure. Finally, the method includes checking continuity of an electrical path between conductive structures using the points of intersection and the vias.

The details of the preferred embodiment of the present invention are set forth in the accompanying drawings and the description below. Once the details of the invention are known, numerous additional innovations and changes will become obvious to one skilled in the art.

BRIEF DESCRIPTION OF THE DRAWINGS

These and other aspects of the invention will now be described in detail with reference to the accompanying drawings, wherein.

DETAILED DESCRIPTION OF THE INVENTION

Figure 1:
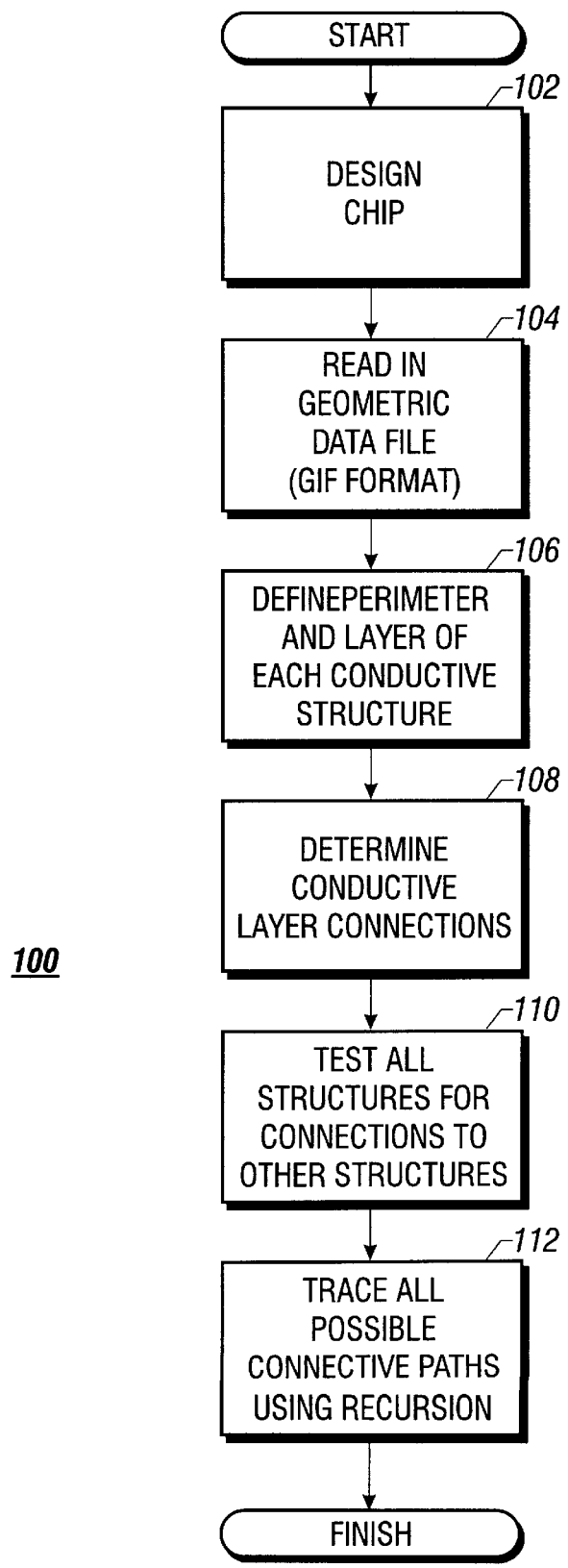
FIG. 1 is a flow diagram showing the preferred embodiment of the present invention.

Throughout this description, the preferred embodiment and examples shown should be considered as exemplars, rather than as limitations on the present invention.

The present invention is a method for testing electrical connections between conductive structures on a chip that has no active electrical devices and no inductors or capacitors. The method is preferably used for testing MMD chips, but may also be used to test any chip consisting of a network of conductive structures electrically connecting external electrical connectors (such as probe pads). A preferred embodiment of the method is shown in the flow diagram of FIG. 1 and is designated generally by reference numeral 100.

A chip is first designed (102), and a data file is then created (104) that contains data pertaining to the chip design. The chip data includes information about the layers of the chip and the conductive structures formed on the layers. Next, the perimeter and layer of each structure on the chip are determined (106) using the data file. The layer connections between each conductive layer are determined (108), and all structures on the chip are tested (110) to find connections to other structures. All possible connective paths are then located using recursive techniques (112). Each step will now be described in greater detail.

The chip may be designed (102) by computer aided design (CAD) techniques. The preferred embodiment employs L-EDIT for chip design, although other CAD tools may be used. L-EDIT may be used to design complex MMD-type chips that have multiple probe pads, multiple conductive and non-conductive layers, many conductive layer connections, and many conductive structures formed on each conductive layer.

An exemplary MMD chip of high complexity is the Vertical Bloch Line ("VBL") chip. VBL chips include an external, magnetized garnet layer. A sandwich of conductive (e.g., metal) layers and insulating (e.g., glass) layers are then built on top of the garnet layer. A variety of conductive structures, including boxes, polygons, and wires, may be formed on each conductive layer by etching away portions of the conductive layer, leaving only the conductive structures. The conductive layers may be interconnected by layer connections, including conductive via structures, which are formed on a specific conductive layer known as a "via layer." The VBL chips are connected to external devices by probe pads, which are interconnected by the polygonal structures, layer connections, and vias. The high complexity of VBL chips makes hand-testing for electrical continuity unreliable and impractical. Accordingly, the method of the present invention was developed to test continuity on VBL and other MMD-type chips.

VBL chips may be used as digital memory devices. Regions of the garnet layer are created where the magnetic field is different from the remainder of the garnet layer. These regions, known as "bubbles," may themselves constitute an element of memory (i.e., a bit), or each bubble may contain multiple elements of memory (e.g., a byte). Various probe pads can then be electrically connected, and currents can be pulsed through the interconnected probe pads. Pulsing currents in this way may alter the location of the bubbles on the garnet layer, may alter their configuration, may destroy them, or may create new ones. Modifying the bubbles changes the contents of the chip's memory.

A data file is preferably created (104) after designing the chip. The data file includes information about the layers of the chip, conductive connections between the layers, probe pads, conductive structures on each layer, and the like. The data file is used to test the electrical connections between structures and between probe pads to find unwanted design errors, such as short circuits or open circuits. Preferably, the data file is created in the CalTech Intermediate Form (CIF) format. The CIF graphics format is described in detail in "Introduction to VLSI Systems," by Carver Mead and Lynn Conway, published by Addison-Wesley Publication Co, 1980. It will be recognized, however, that other suitable formats exist.

The CIF files describe every geometric structure in the chip design and the layer on which each structure is located. For example, the CIF may contain structures in the form of boxes, polygons, and wires. The CIF file for boxes has the following format:

Indicator ("B"), Length, Width, Center_X, Center_Y

The CIF file for polygons has the following, different format:

Indicator ("P"), Point_X1, Point_Y1, Point_X2, Point_Y2, . . .

Finally, the CIF file for wires has the following format:

Indicator ("W"), Width, Point_X1, Point_Y1, Point_X2, Point_Y2, . . .

These formats set forth above are merely exemplary, and it will be understood that alternative formats exist. For example, the polygon format could be used generically to encompass wires and boxes. The formats are used to aid in determining equations that define (or at least approximate) the perimeter of the various structures on the chip, as will be described in further detail below. It will also be understood that the present invention is not limited to polygonal structures and can be used with curved structures. The term "curved structure," as used in this description, refers to any structure of which at least a portion of its perimeter is non-linear. Examples of such curved structures include circles, ellipsoids, paraboloids, and the like. The present invention accounts for curved structures by determining an equation defining (or approximating) the perimeter of the curved structure, as will be explained below.

Figure 2A:
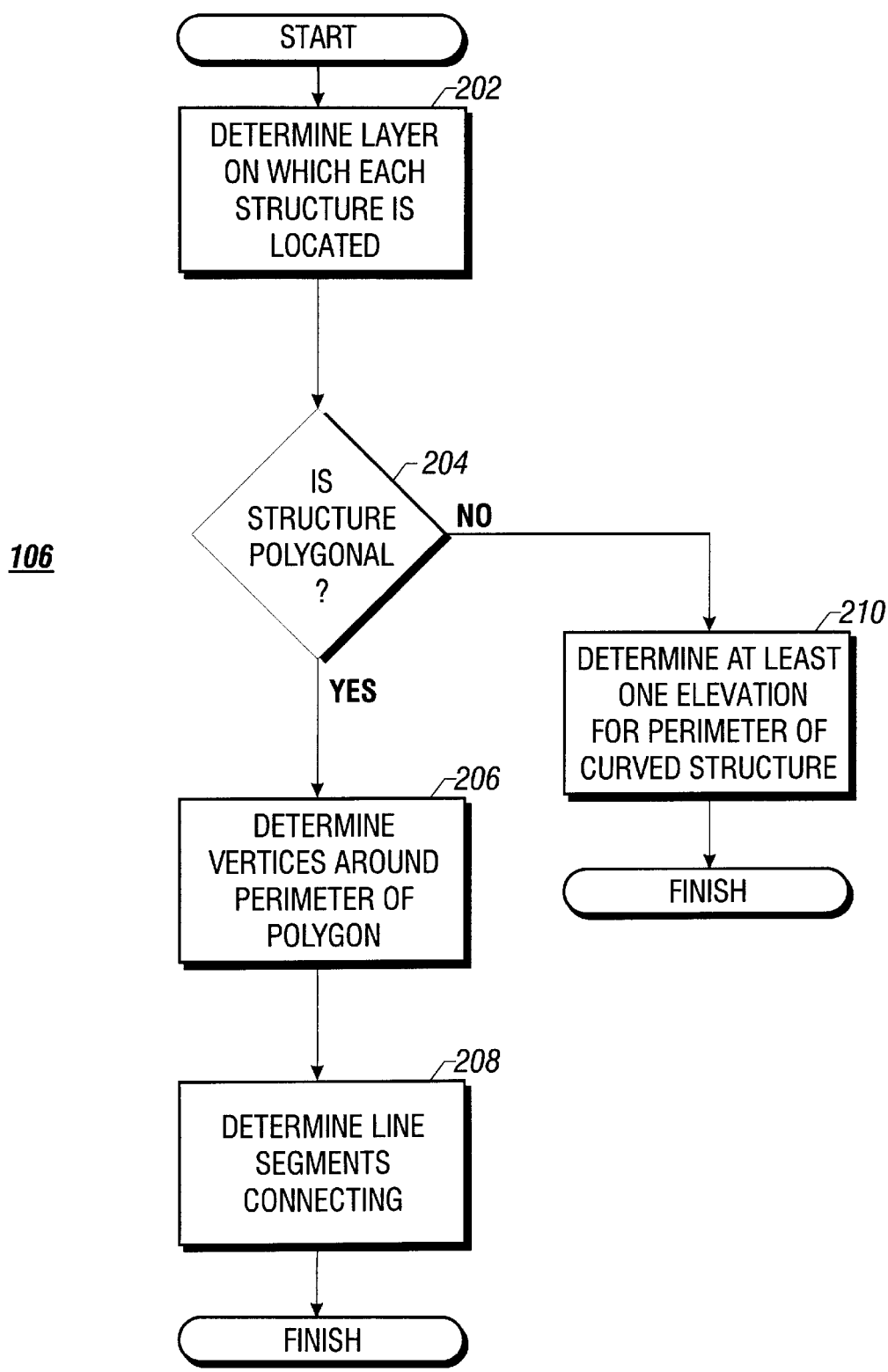
FIG. 2A is a flow diagram showing the steps for defining the perimeter and layer of a conductive structure in accordance with the present invention.

FIG. 2A is a flow diagram showing details of the step (106) for defining the perimeter and layer of each structure on the chip. The structures may include polygonal structures—such as boxes, wires, and other polygons— curved structures, vias, and probe pads. The layer on which each structure is located is then identified (202). The layer is preferably known from the design of the chip and is part of the CIF file. The structure is examined (204) to determine if it is a polygonal or a curved structure. Step (204) is optional, however, as the chip may be designed only with polygonal structures or only with curved structures. The vertices around the perimeter of each polygonal structure are determined (206). Then, line segments connecting the vertices are defined (208). The line segments define (or closely approximate) the perimeter of the polygonal structures.

The method determines at least one equation (210) for each curved structure that defines (or at least approximates) the perimeter of the curved structure. The perimeter of a curved structure may be defined by several different curves, in which case an equation is determined in step (210) for each curve. Also, curved structures may be partly curved and partly linear, in which case step (210) may involve several substeps, including determining vertices for the linear portion, determining line segments connecting the vertices, and determining an equation for each curved portion.

Figure 2B:
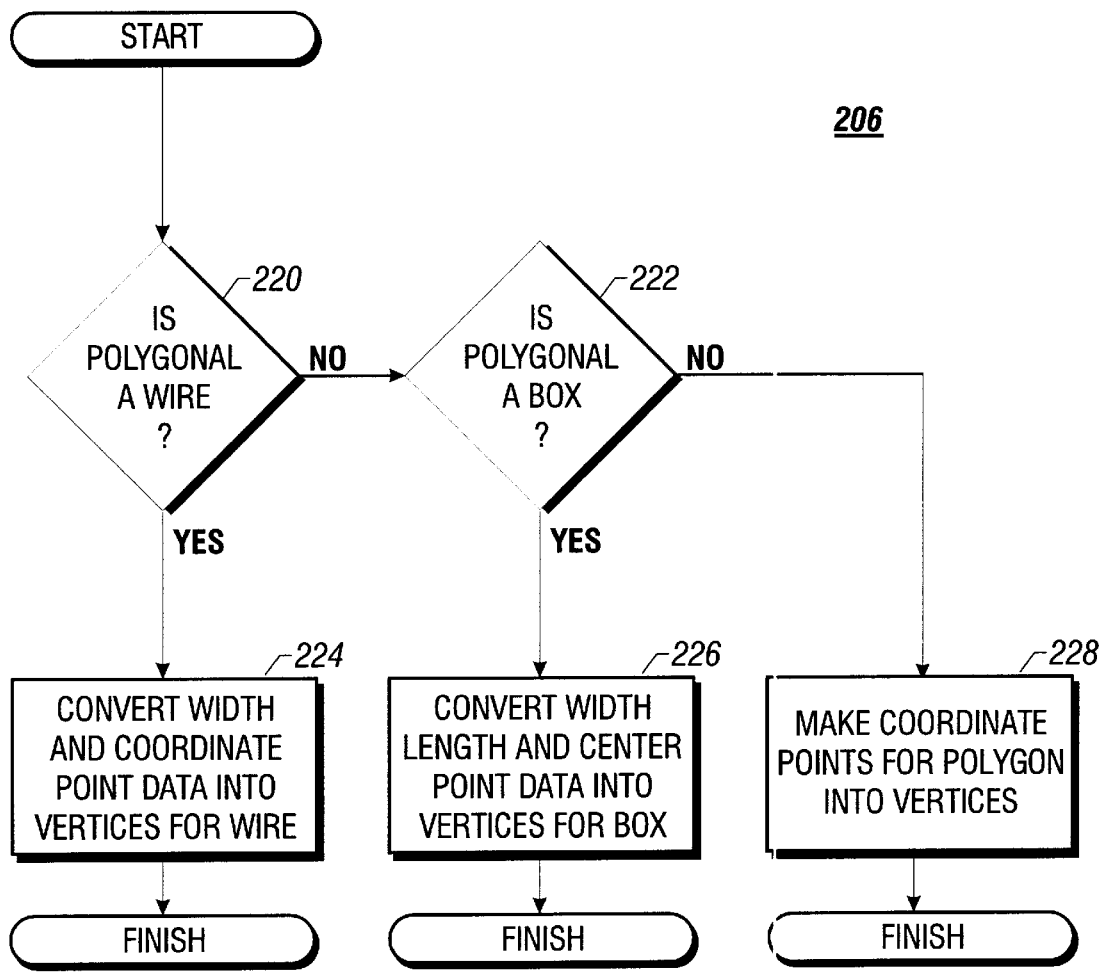
FIG. 2B is a flow diagram showing the steps for determining vertices around the perimeter of a polygonal structure in accordance with the present invention.

FIG. 2B is a flow diagram showing in greater detail the step (206) of determining the vertices of a polygon. The polygon is checked (220) to determine whether it is a wire. A non-wire polygon is checked (222) to determine whether it is a box (i.e., rectangular) if a CIF file is being used. Boxes are converted (224) into vertices using the CIF file width, length, and center point data. The CIF file points defining the perimeter of a non-box polygon become its vertices (226). Wire polygons are converted (228) into vertices using the width and perimeter data points of the wire.

Figure 2C:
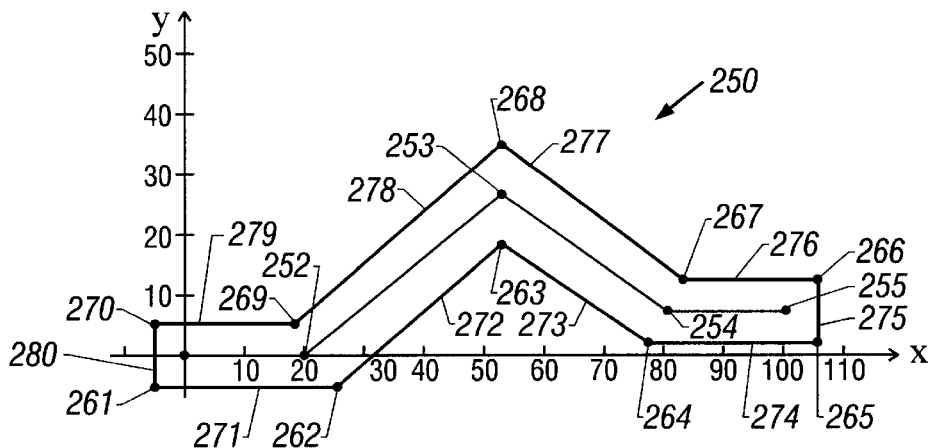
FIG. 2C is a graph showing an exemplary wire structure with three bends along its length.

FIG. 2C graphically shows how an exemplary wire structure 250 is converted (step 224) from the CIF file format into a set of vertices around the perimeter of the wire 250. The CIF file data for the wire 250 constitutes the wire width, W, which in this case is 10 units, and five coordinate points along the length, and at the center, of the wire 250. The five coordinate points correspond to end points 251, 255 of the wire 250 and three bends 252–254 in the wire 250. The CIF format for the coordinate points of wire structures is preferably set up in this manner, with points being designated along the center of the wire structure for the end points and each bend.

The wire structure 250 is then converted into a set of vertices 261–270 around its perimeter. An extension of half the width, W, of the wire 250 is added at the end points 251, 255. Thus, wire end vertices 261, 271 and 265, 266 are extended 5 units (i.e., ½*W) in the x-direction from end points 251, 255, respectively. A set of line segments 271–280 is then determined (see step 208) using the vertices 261–270, thereby defining (or at least approximating) the perimeter of the wire 250.

Figure 2D:
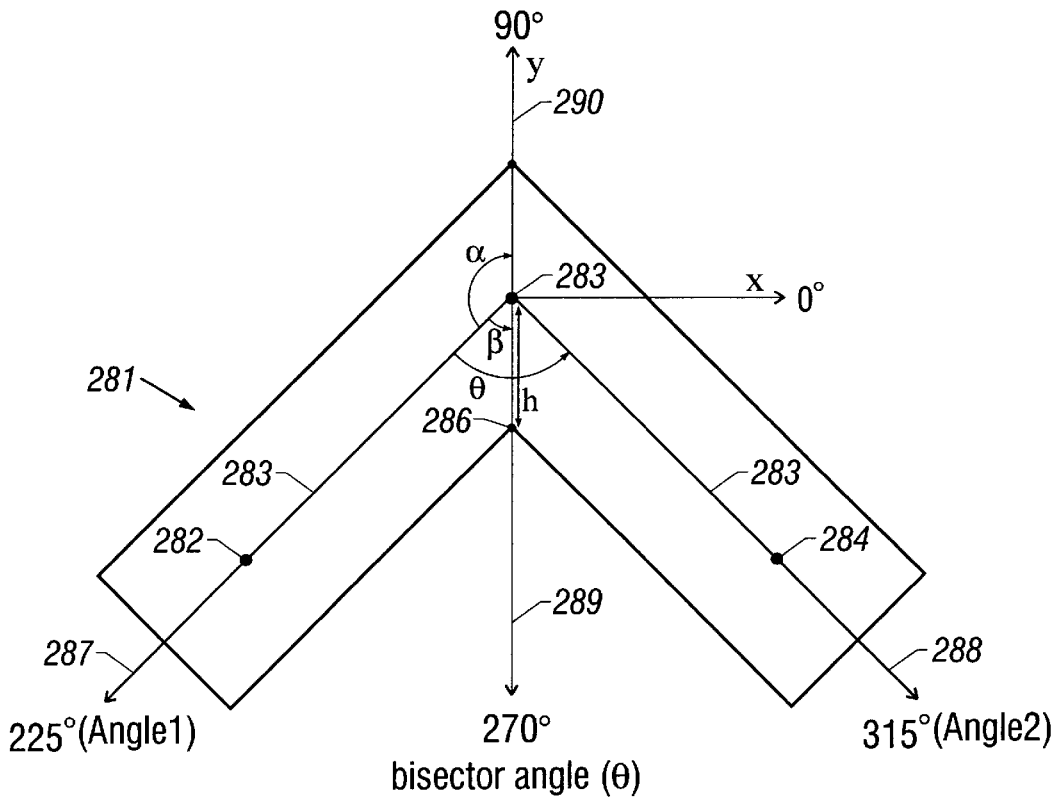
FIG. 2D is a graphical representation of a wire structure with a bend along its length.
Figure 2E:
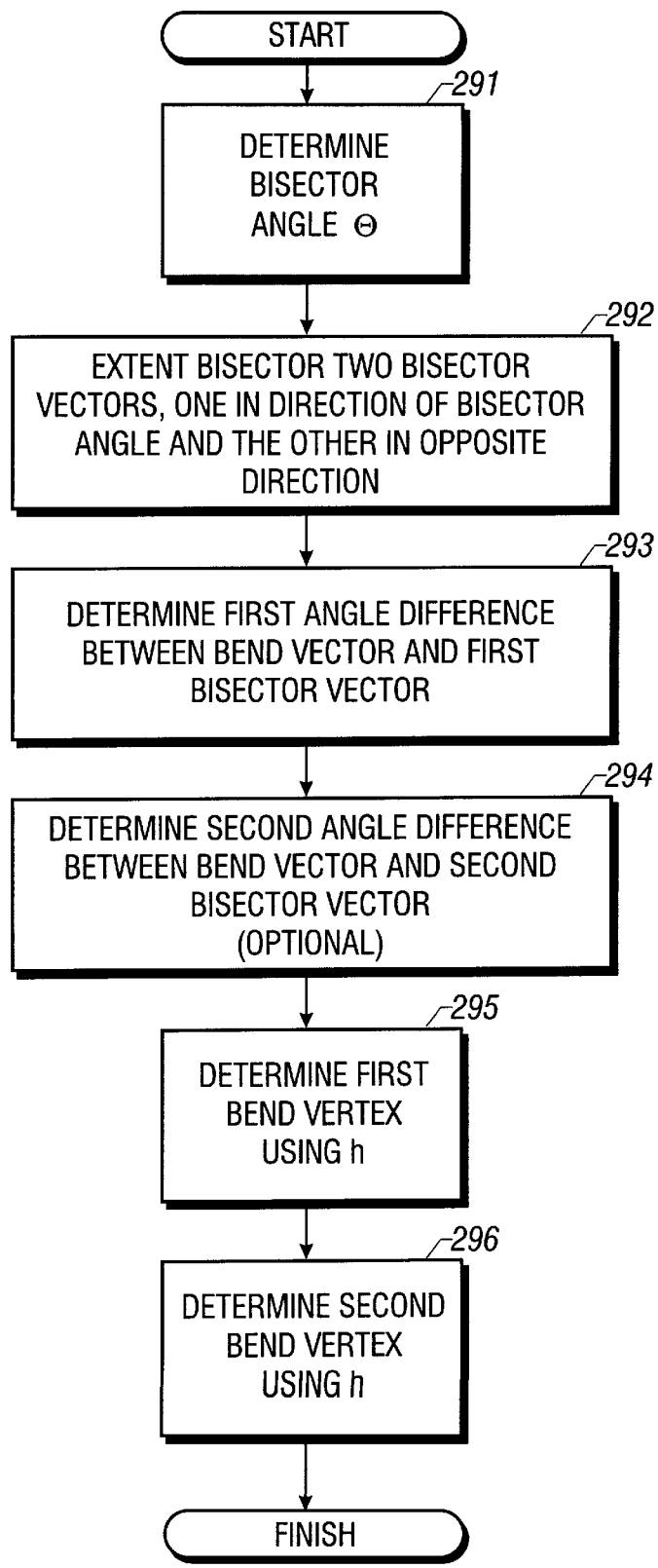
FIG. 2E is a flow diagram showing the steps for determining the vertices of a wire structure with a bend along its length in accordance with the present invention.

FIGS. 2D and 2E illustrate in greater detail the step (224) of converting CIF file wire data into vertices for a wire structure having at least one bend. The wire 281 has a width of 10 units and three CIF coordinate points 282–284. The lines (or bend vectors) 287, 288 extend from a bend coordinate point 283 through end coordinate points 283, 284 to form a bend angle, φ. The first bend vector 287 defines an Angle 1, which is a 225° angle from the x-axis, which is at 0°. The second bend vector 288 defines and Angle 2, which is 315° from the x-axis.

Vertices 285, 286 at the bend point 283 are determined by first defining (step 291, see FIG. 2E) a bisector angle, θ, bisecting the bend angle, φ. The bisector angle in this case is 270° from the x-axis. The next step (292) is to extend a first bisector vector 289 from the bend point 286 in the direction of the bisector angle, θ, and a second bisector vector 290 in the opposite direction (i.e., 180° from the first bisector vector 289). A first angle difference, β, between one of the bend vectors 287, 288 and the first bisector vector 289 is determined (293), and a second angle difference, γ, between one of the bend vectors 287, 288 and the second bisector vector 290 is determined (294).

The first bend vertex 285 is determined (295) by finding a distance, h, and setting the first bend vertex 285 on the first bisector vector 289 at the distance h from the bend point 283, where:

$$h=|(W/2)/(\sin (\beta*\pi/180)|. \quad \text{(Eq.1)}$$

The second bend vertex 285 is determined (296) to be on the second bisector vector 290 the distance h from bend point 283. Equation 1 provides an h of 7.1 for the example of FIG. 2D, because: $|10/2(\sin (45*3.14159/180)|=7.1$. It will be recognized that step 294, in which the second angle difference, γ, is found, is optional. Moreover, it will be recognized that Equation 1 can be modified, such that the distance h is determined using the second angle difference, γ, in place of the first angle difference, β.

The changes in the x- and y-directions when converting the bend point 283 into the two bend vertices 285, 286 can also be calculated using the following equations:

$$\nabla x=\cos (\theta*\pi/180)*h, \text{ and} \quad \text{(Eq. 2)}$$

$$\nabla y=\sin (\theta*\pi/180)*h. \quad \text{(Eq. 3)}$$

Equation 2 provides a $\nabla x$ of zero in the example of FIG. 2D. ($\nabla x=\cos (270*3.14159/180)*7.1=0$.) Equation 3 provides a $\nabla y$ of −7.1. ($\nabla y=\sin (170*3.14159/180)*7.1=-7.1$.)

The next step in the method of FIG. 1 (i.e., step 108) is to determine user defined layer connections between conductive layers. The chip may be designed with various electrical connections between the conductive layers that allow current to flow from one conductive layer to another conductive layer. These layer connections are user-defined and cannot be determined from the CIF file. Thus, the user defines those connections in step 108. The layer connections may include vias as well as other types of layer connections. A "via" is a conductive structure that is formed by a conductive "via" layer. The perimeter of a via structure is contained within another conductive. The process for locating vias will be explained below in connection with FIG. 4.

Figure 3A:
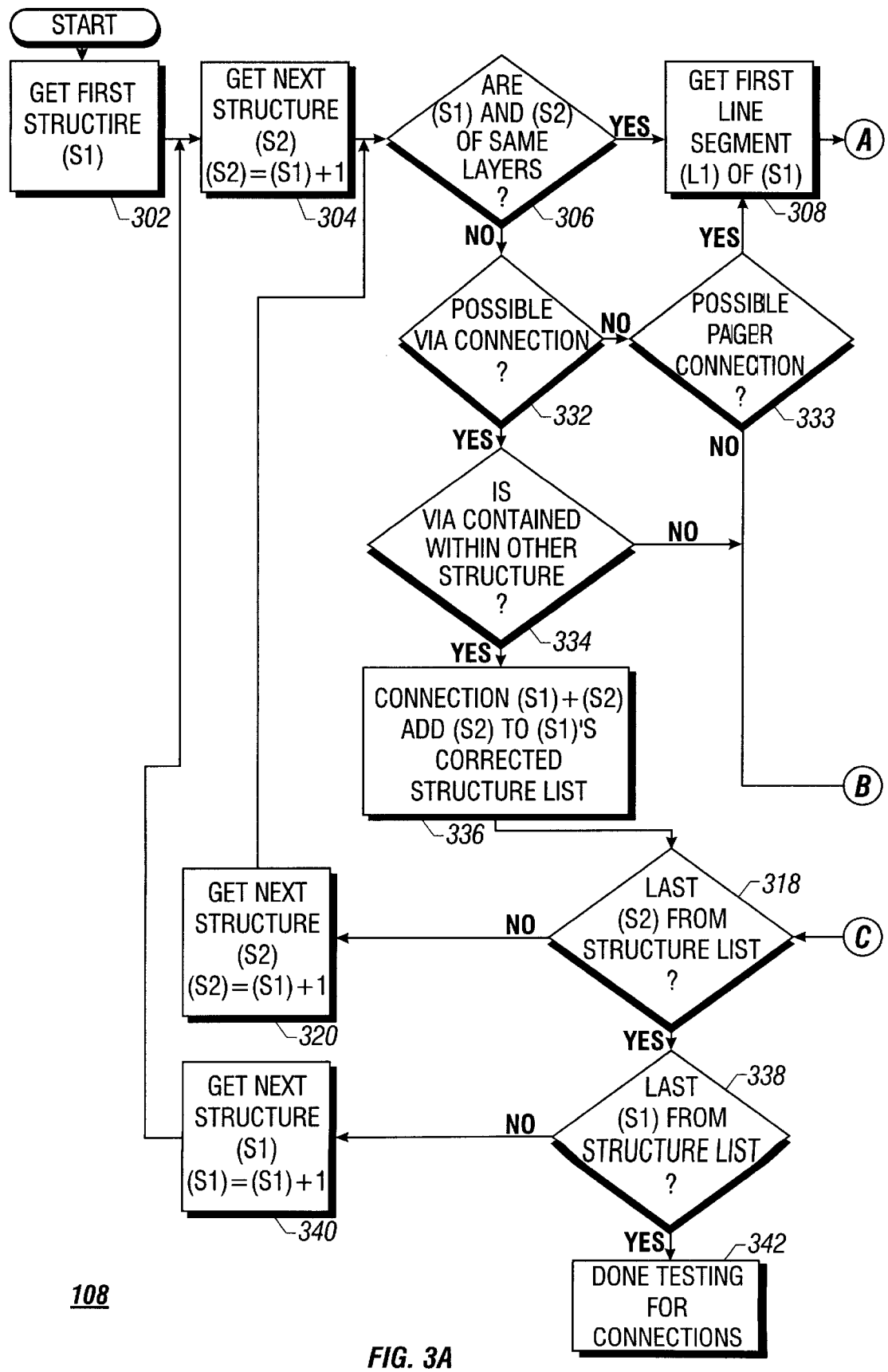
FIG. 3 is a flow diagram showing the steps for testing all structures on the chip for connectivity to other structures in accordance with the present invention.
Figure 3B:
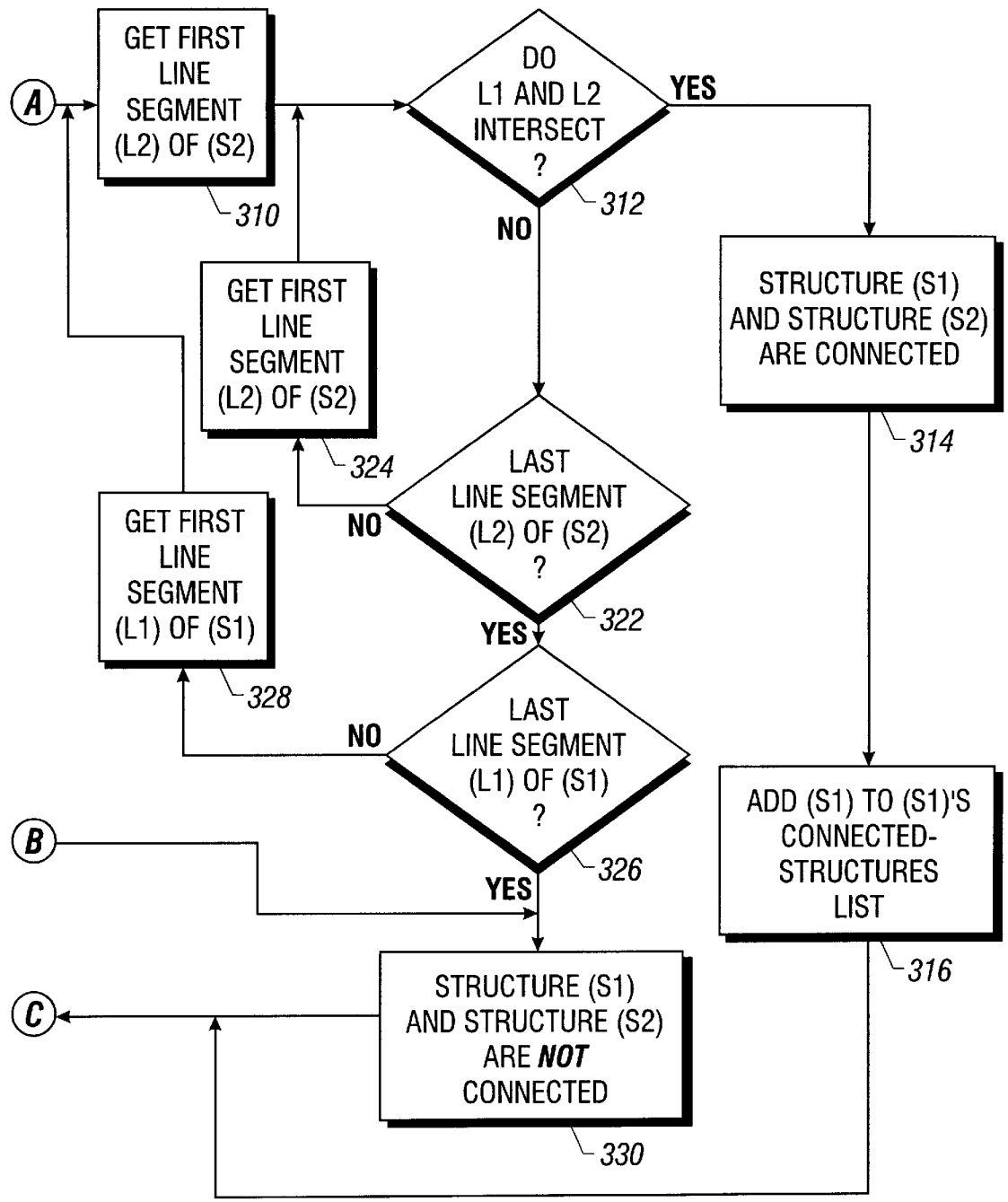

FIG. 3 is a flow diagram showing in greater detail the step (110) of testing interconnections between all the structures on the chip. A list is created for each structure indicating the other structures to which it is connected. This is done by finding overlapping structures, which can be determined by checking for points of intersection between the perimeters of the structures. Structures whose perimeters intersect are electrically connected. The perimeter of every structure is tested against the perimeter of every other structure on the chip to determine all points of intersection and thus all connected structures on the chip. An array or list of connected structures may be stored for each structure.

The first step in testing electrical connectivity of structures on the chip is to select (302) a first structure, S1, and then select (304) a second structure, S2, where S2=S1+1. Next, S1 and S2 are checked to determine if they are on the same layer (306). If they are, a first line segment, L1, defining a portion of the perimeter of S1, is determined (308), and then a second perimeter line segment, L2, is determined for S2 (310). A check is made to determine whether L1 and L2 intersect (312). If they do, the perimeters of S1 and S2 also intersect (314), and S2 is added to S1's list of connected structures (316). The check made in step 312 need not be performed, however, if the line segments L1 and L2 are parallel, because parallel line segments will have no point of intersection.

S2 is then checked (318) to determine if it is the last structure to be checked for connectivity with S1. Thus, it must be determined whether all structures have been checked for connectivity with S1 before selecting a next S1. A next S2 structure is selected (320) to test for connectivity with S1 if the current S2 was not the last structure. The next S2 is incremented from the current S2 (i.e., next S2=current S2+1). The method then loops back to step 306.

It may be determined in step 312 that L1 and L2 do not intersect, in which case the method checks whether L2 is the last line segment of S2 (322). A next L2 line segment of S2 is fetched (324) if the response to step 322 is negative. On the other hand, if it is determined in step 322 that the L2 line segment being examined is the last line segment of S2, the method checks (326) to see if the L1 line segment being tested is the last line segment of S1. The next L1 line segment of SI is fetched (328) if the previous L1 was not the last line segment of S1, and the method loops back to step 310. On the other hand, determining that the L1 being tested is the last line segment of S1 means that S1 and S2 are not connected, and the method continues to step 318 to check if the S2 being tested is the last structure to be tested.

Determining in step 306 that S1 and S2 are not on the same layer causes the method to check whether the two structures are a possible via connection (332). This is done by examining both S1 and S2 to determine if either structure is on a via layer. If either S1 or S2 is on a via layer, and the other structure is on a conductive layer adjacent to the via layer, the method determines (334) whether the suspected via structure (either S1 or S2) is contained within the other structure and is thus a via. The process for determining whether the suspected via is contained within the other structure is described in greater detail below, in connection with the description of FIG. 4. The method continues to step 330 if it is determined that the suspected via is not contained within the other structure. On the other hand, S1 and S2 are found to be connected (336) if the via is contained within another structure, and S2 is added to S1's list of connected structures (336).

The method then continues to step 318, where it is determined whether S2 is the last structure from the list of structures to be tested for connectivity with S1. If S2 is the last such structure, the method determines whether the current S1 is the last structure to be tested for connectivity (338). The next S1 structure is fetched (340) if the current S1 is not the last structure to be tested, where the next S1 is equal to the current S1 incremented by one (i.e., next S1=current S1+1). On the other hand, connectivity testing is complete (342) if S1 is the last structure to be tested.

Determining in step 332 that no possible via connection exists causes the method to determine (333) if S1 and S2 may be connected by a different type of layer connection, other than a via connection. This is done by examining the userdefined layer connections of step 108. A determination in step 332 that S1 and S2 cannot be connected by such a layer connection causes the method to conclude (330) that S1 and S2 are not electrically connected, and the process continues to step 318. On the other hand, concluding in step 333 that S1 and S2 may be connected by a layer connection causes the method to continue to step 308 to check whether S1 and S2 are overlapping structures.

The process for testing connections between structures of step 110 can be adopted for curved structures. For example, the perimeter of a circular structure is defined by an equation. This equation is substituted in step 110 for the line segments defining the perimeter of polygonal structures. The equation is then compared to the line segments or equations of another structure to determine if the curved structure is connected to the other structure.

Figure 4:
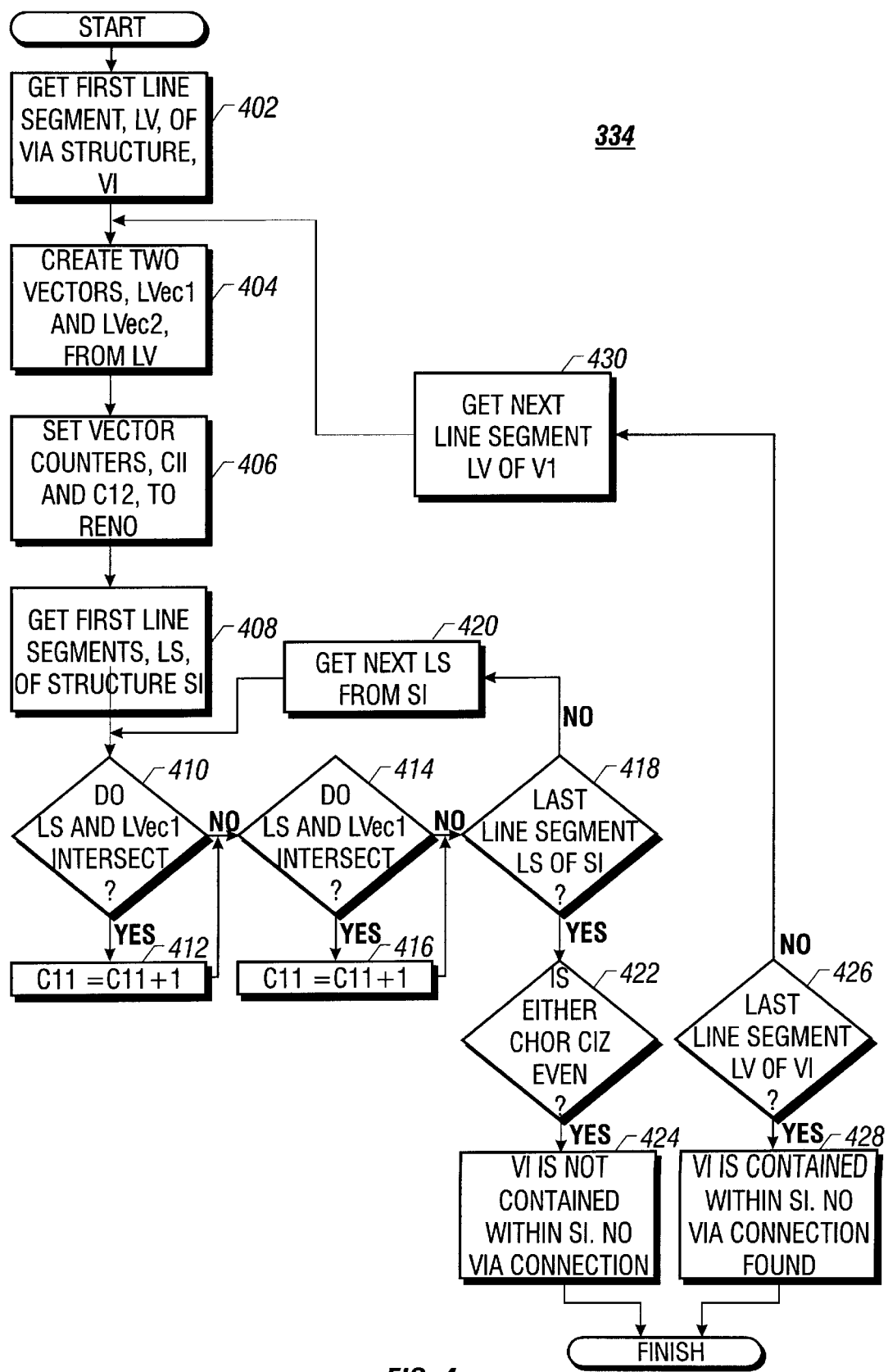
FIG. 4 is a flow diagram showing the steps for locating via structures by determining whether a suspected via is contained within another structure according to the present invention.

FIG. 4 is a flow diagram illustrating in greater detail step 334 of determining whether a suspected via, V1, is contained within another structure, S1. A via cannot be detected using the overlapping line segment test for other structures described above, because a via is contained within another structure. Thus, the line segments of a via will not intersect the containing structure. Accordingly, the following steps are performed to locate vias.

The first step (402) is to obtain a first line segment, LV, of the suspected via structure, V1. Two vectors are created, LVec1 and LVec2, from LV (404). The vectors preferably begin from the same point along LV and extend substantially infinitely from that point in opposite directions. Vector counters, C11 and C12, are then defined and set to zero (406). Next, a first line segment, LS, of structure S1 is obtained (408), and a determination is made (410) whether LS and LVec1 intersect. Counter C11 is incremented by one (412) if LS and LVec1 do intersect, and, in either event, the method checks whether LS and LVec2 intersect (414). Counter C12 is incremented by one (416) if LS and LVec2 do intersect, and, in either event, the method checks (418) whether the current LS is the last line segment of S1. A next LS is obtained (420) if the current LS is not the last line segment of S1, the process loops back to step 410, and the new LS is checked for intersection with LVec1 and LVec2.

The process checks (422) whether either C11 or C12 is even if the current LS is the last line segment of S1 to be tested. A determination that either C11 or C12 is even means that the suspected via, V1, is not contained within S1 (424) and that, therefore, no via connection exists. The process then concludes. On the other hand, a determination that either C11 or C12 is odd causes the process to check (426) whether the current LV is the last line segment of the suspected via, V1. A determination that the current LV is the last line segment of V1 means that V1 is contained within S1 (428) and that a via connection has been found. The process then concludes. On the other hand, the next line segment LV of V1 must be obtained (430) if the current LV is not the last line segment, and the process loops back to step 404. Then, new vectors are created from the new LV, and points of intersection are tested in the same fashion.

Thus, the process for locating vias involves determining, for each vector, the number of times the vector intersects the perimeter of structure S1. V1 is contained within S1, and is therefore a via, if each vector of V1 intersects the perimeter of S1 an odd number of times.

The last step (112) in the method of FIG. 1 is to determine all possible electrically connective paths on the chip, preferably using recursive techniques. The following example illustrates the recursive process of the present invention. A chip is defined as having structures 1 through N. Each structure, S, has its own list of other structures, 1 through C, that are immediately connected to S. For example, TABLE 1 below contains a list of four structures (1–4) and the other structures to which those structures are immediately connected:

TABLE 1

| STRUCTURE NUMBER | CONNECTED STRUCTURES |
|---|---|
| 1 | 2 |
| 2 | 1, 4, 5 |
| 3 | 5, 8, 10 |
| 4 | 2, 10, 22, 434 |

It can be deduced by association that structure 1 of TABLE 1 is connected to structure 434.

The most efficient way for a computer program to search through an extremely large data table (similar to that of TABLE 1) is to use recursion. Each structure is used as a starting point. The starting structure is searched for connected structures. Successive structures are added at every connected structure, and the successive structures are also searched for connecting structures, until all possible connections are searched and located from the starting structure. The totality of connections provides all electrically connective paths on the chip.

TABLE 2, which follows, provides pseudo-code for the recursive process of the present invention. Preferably, only the structures defined as probe pads are used as starting points, instead of any random conductive structure on the chip. This significantly reduces processing time.

TABLE 2

```
N = total # of structures;
Visited_list[ ] = list of structures that have been accounted
    for and are not to be repeated;
for(int i = 1; i ≦ N; i++) {
    Clear Visited_list[ ];
    Recurse(i);
}
int Recurse(int start) {
    C= total # of structures connected to structure(start);
    add structure(start) to Visited_list[ ];
    for(int j = 0; j ≦ C; j++) {
        test_structure = connected structure(j) of
            structure(start);
        if(test_structure is not on Visited_list) {
            add test_structure to structure(i)'s new list
                of connected structures;
            Recurse(test_structure);
        }
        else continue looping through test_structures;
    }
    return(0);
}
```

Figure 5:
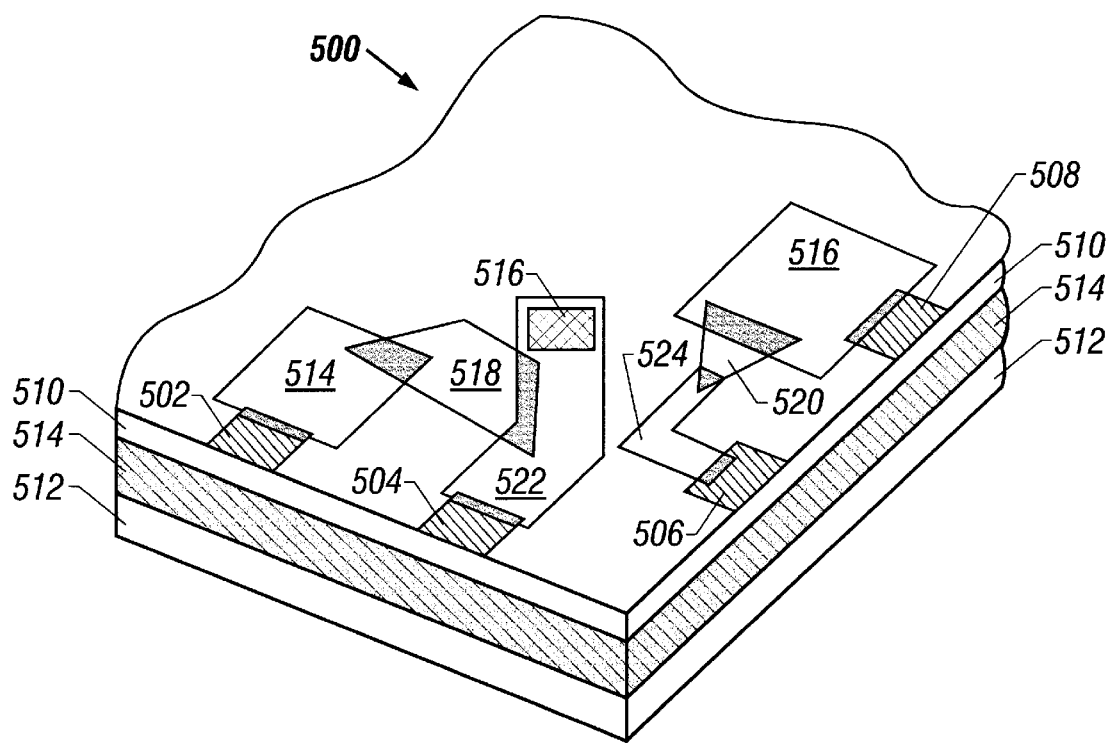
FIG. 5 is a perspective cut-away view of an exemplary chip consisting of a network of conductive structures electrically connecting conductive probe pads.

An exemplary MMD chip 500 is shown in FIG. 5, in which a cut-away region of the chip 500 is shown from a perspective view. The chip 500 has several probe pads 502, 504, 506, 508, two conductive layers 510, 512, and a non-conductive layer 514. It will be recognized that the chip 500 may have many additional conductive and non-conductive layers. Each conductive layer may be of a different conductor or metal type, including permalloy and connect layers. The chip 500 has a via 516 connecting the conductive layers 510, 512, through which current passes.

The probe pads 502, 504, 506, 508 are connected by a series of conductive structures—boxes 514, 516, polygons 518, 520, and wires 522, 524. Current passes between overlapping structures that are on the same layer. Probe pads 502 and 504 are connected to one another by box 514, overlapping polygon 518, and overlapping wire 522. Probe pads 506 and 508 are electrically connected to one another by box 516, overlapping polygon 520, and overlapping wire 524.

Via 516 provides an electrical connection between wire 522 on conductive layer 510 and conductive layer 512. Therefore, probe pads 502 and 504 are electrically connected to conductive layer 512. The method of the present invention determines that structure 516 is a via because it is completely contained within another structure, namely, wire 522.

The present invention tests electrical continuity between the probe pads on exemplary chip 500 by the preferred method of FIG. 1. Thus, the design of the chip 500 is read into a geometric CIF data file (104). The perimeter of each conductive structure (i.e., the probe pads 502, 504, 506, 508; boxes 514, 516; polygons 518, 520; wires 522, 524; and via 516) is then determined (106), and the connections between the conductive layers 510, 512 are determined (108). The only connection between the conductive layers 510, 512 on chip 500 is via 516. Each structure is then tested (110) to determine all other structures to which that structure is connected. All possible connective paths may then be traced using recursion (112).

The present invention may be implemented in hardware, firmware, software, or a combination of the three. Preferably, however, the invention is implemented in a computer program, which is preferably written in C++ language and uses two Unix programming tools, Lex and Yacc, to recognize and parse the data. The computer program is executed on a programmable computer having a processor, a data storage system, volatile and non-volatile memory and/or storage elements, at least one input device, and at least one output device. Program code is applied to input data to perform the functions described herein and generate output information. The output information is applied to one or more output devices, in known fashion.

The computer program, once compiled, is preferably equipped with several command functions. A first command allows the program user to view a list of structures and their location on the chip. A second command allows the user to view the entire net list of structures, showing the type of structure (i.e., probe pad, via, wire, etc.), and the vertices describing its perimeter. This second command is useful for tracing errors in chip design. A third command allows the user to view a list of structures to which a specified structure is connected. This permits the user to locate the structure at which a conductive break occurred and, using the second command, provides the location of that structure. A fourth command prompts the user to enter two or more structures (e.g., probe pads) and tests whether they are connected to each other. The fifth command prompts the user to enter a probe pad number and creates a CIF file for that pad that can be read back into L-EDIT. The CIF file contains all the connections associated with that probe pad, allowing the user to see the connected path, or, in the case of an error, to see where the error occurred in the chip design.

Figure 6:
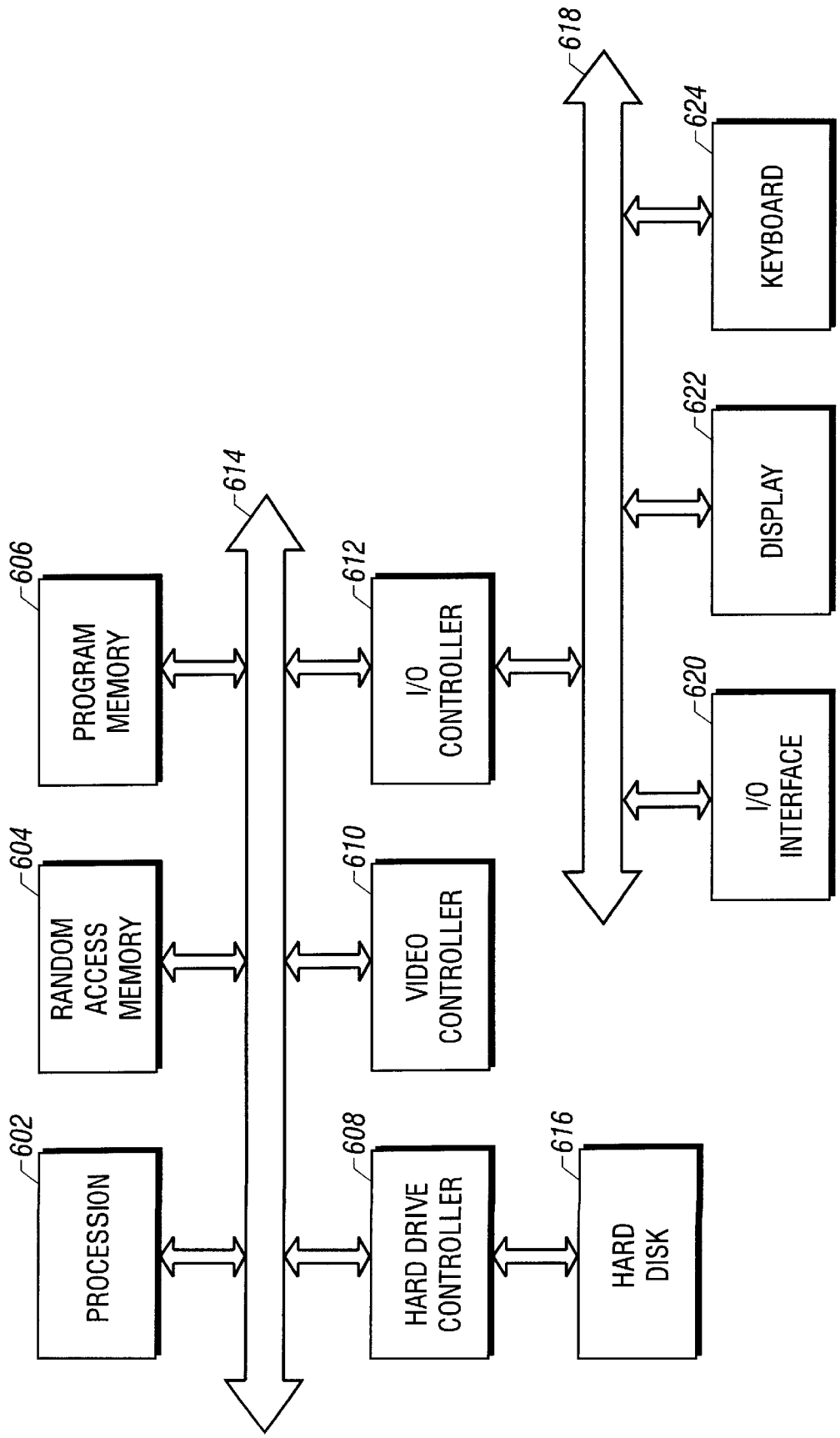
FIG. 6 is a schematic block diagram of a programmable computer suitable for executing computer programs according to the present invention.

FIG. 6 shows a block diagram of an exemplary programmable processing system (computer) 600. The computer 600 preferably includes a processor 602, a random access memory (RAM) 604, a program memory 606 (preferably a writable read-only memory (ROM), such as a flash ROM), a hard drive controller 608, a video controller 610, and an input/output (I/O) controller 612 coupled by a CPU bus 614.

The hard drive controller 608 is coupled to a hard disk 616, which may be used for storing application programs, including programs embodying the present invention, and data. The I/O controller 612 is coupled by means of an I/O bus 618 to an I/O interface 620. The I/O interface 620 receives and transmits data in analog or digital form over communication links, such as a serial link, local area network, wireless link, or parallel link. Also coupled to the I/O bus 618 is a display 622 and keyboard 624. Alternatively, separate connections (separate buses) may be used for the I/O interface 620, display 622 and keyboard 624. The computer system 600 may be preprogrammed, or it may be programmed (and reprogrammed) by loading a program from another source (e.g., a floppy disk, CD-ROM, or another computer).

Each computer program is preferably stored on a storage media or device (e.g., program memory 606 or magnetic diskette) readable by a general or special purpose programmable computer, for configuring and operating the computer when the storage media or device is read by the computer to perform the procedures described in this specification. The invention may also be considered to be implemented as a computer-readable storage medium, configured with a computer program, where the storage medium so configured causes a computer to operate in a specific and predefined manner to perform the steps of the invention.

Although only a few embodiments have been described above, those having ordinary skill in the art will readily realize that many modifications are possible without departing from the advantageous teaching herein. For example, the structures may be tested to determine their resistivity, allowing predictions to be made of the resistance between each connection on the chip. This is done by meshing (or triangulating) the path between two probe pads and then using a finite elements method, in known fashion, to solve for the resistance. Other similar modifications will also be apparent to those having ordinary skill in the art and are intended to be encompassed within the following claims.

What is claimed is:

1. A method for verifying electrical connectivity of at least a portion of a defective chip design characterized by a plurality of overlapping conductive layers, each overlapping conductive layer provided with an associated set of conductive structures disposed thereon, the conductive structures collectively cooperatively defining electrically-linked paths devoid of active electrical devices, capacitors, and inductors, the method comprising:

identifying a location of each conductive structure including the associated layer;

identifying layer connections conductively joining conductive Structures on different layers; and verifying, on the basis of the identified locations of each conductive structure and the identified layer connections, electrical connectivity of the electrically-linked paths.

2. The method of claim 1, wherein each conductive structure has a perimeter; and wherein said identifying a location includes defining, for each conductive structure, the perimeter of the conductive structure, and wherein the step of verifying includes determining, for each conductive structure, points of intersection between the perimeter of the conductive structure and the perimeter of at least all conductive structures in spatial proximity thereto.

3. The method of claim 2, wherein the portion includes a plurality of polygonal conductive structures located on a first conductive layer and at least one via electrically connecting the first conductive layer to a second conductive layer, wherein said defining the perimeter of each conductive structure includes determining, for each polygonal conductive structure, a set of line segments defining the perimeter of each polygonal conductive structure, and wherein said identifying conductive layer connections includes locating the at least one via.

4. The method of claim 2, wherein each electrically-linked path includes at least two probe pads, separated by at least one conductive structure, for electrically connecting to an external electrical device.

5. The method of claim 4, wherein the verifying includes tracing all electrically-linked paths between available probe pads using recursion.

6. The method of claim 2, wherein at least one perimeter is polygonal, the method further comprising:

defining for each perimeter a set of line segments, said determining points of intersection comprising determining points of intersection between the set of line segments associated with the polygonal perimeter and the set of line segments for each perimeter of at least all conductive structures in spatial proximity.

7. The method of claim 6, wherein each line segment is comprised of a set of vertices generated as a function of the location of the perimeter of an associated conductive structure on a known layer.

8. The method of claim 6, wherein the portion includes at least one via, of known perimeter, electrically connecting the first conductive layer to a second conductive layer, wherein said identifying layer connections includes identifying that the perimeter of the via is contained within the perimeter of a conductive structure, and wherein the step of verifying includes verifying the electrical conductivity of any electrically-linked path including the at least one via.

9. The method of claim 2, wherein said determining points of intersection includes the step of identifying, for each conductive structure, a list of conductive structures to which such conductive structure is electrically connected.

10. The method of claim 7, wherein the polygonal perimeter is defined by at least one box, with each box defined by a length, width, and a center point, and wherein the set of vertices are generated by converting the length, the width and the center point of the box into a set of vertices along the perimeter of the box.

11. The method of claim 7, wherein the polygonal perimeter is defined by a wire, with each wire defined by a width, and a set of points, and wherein the set of vertices are generated by converting the width and the set of points of the wire into a set of vertices along the perimeter of the wire.

12. A method of verifying electrical connectivity of at least a portion of a defective chip design characterized by a plurality of overlapping conductive layers, each overlapping conductive layer provided with an associated set of conductive structures disposed thereon, the conductive structures collectively cooperatively defining electrically-linked paths devoid of active electrical devices, capacitors, and inductors, the method comprising:

identifying a location of each conductive structure including the associated layer;

identifying layer connections conductively joining conductive structures on different layers; and verifying, on the basis of the identified locations of each conductive structure and the identified layer connections, electrical connectivity of the electrically-linked paths, further wherein each conductive structure has a perimeter, at least one of the perimeters being polygonal, the step of identifying a location includes defining, for each conductive structure, the perimeter of the conductive structure, and said verifying includes determining, for each conductive structure, points of intersection between the perimeter of the conductive structure and the perimeter of at least all conductive structures in spatial proximity thereto;

defining, for each perimeter, a set of line segments, said determining points of intersection comprising determining points of intersection between the set of line segments associated with the polygonal perimeter and the set of line segments for each perimeter of at least all conductive structures in spatial proximity, each line segment being comprised of a set of vertices generated as a function of the location of the perimeter of an associated conductive structure on a known layer, wherein the polygonal perimeter is defined by a wire, with each wire defined by a width, and a set of points, and wherein the set of vertices are generated by converting the width and the set of points of the wire into a set of vertices along the perimeter of the wire;

wherein a wire being converted has at least one bend having a bend point at approximately the bend in the wire, the bend point being included in the set of points, the bend being defined by a bend angle, the bend angle being defined by two bend vectors; and wherein the step of converting the width and the set of points into a set of vertices for the converted wire further includes:

determining a bisector angle at the bend, extending a first bisector vector from the bend in the direction of the bisector angle and a second bisector vector from the bend in a direction of 180 degrees from the direction of the first bisector vector, determining an angle difference between either the first bisector vector or the second bisector vector and one of the bend vectors, setting a first bend vertex of the wire at a distance h from the bend point along the first bisector vector, the distance h being determined from the angle difference and the width of the wire, and setting a second bend vertex of the wire at the distance h from the bend point along the second bisector vector.

13. A method of verifying electrical connectivity of at least a portion of a defective chip design characterized by a plurality of overlapping conductive layers, each overlapping conductive layer provided with an associated set of conductive structures disposed thereon, the conductive structures collectively cooperatively defining electrically-linked paths devoid of active electrical devices, capacitors, and inductors, the method comprising:

identifying a location of each conductive structure including the associated layer;

identifying layer connections conductively joining conductive structures on different layers; and verifying, on the basis of the identified locations of each conductive structure and the identified layer connections, electrical connectivity of the electrically-linked paths, wherein each conductive structure has a perimeter, at least one of the perimeters being polygonal;

wherein said identifying a location includes defining, for each conductive structure, the perimeter of the conductive structure, and wherein said verifying includes determining, for each conductive structure, points of intersection between the perimeter of the conductive structure and the perimeter of at least all conductive structures in spatial proximity thereto;

defining, for each perimeter, a set of line segments, said determining points of intersection comprising determining points of intersection between the set of line segments associated with the polygonal perimeter and the set of line segments for each perimeter of at least all conductive structures in spatial proximity, wherein the portion includes at least one via, of known perimeter, electrically connecting the first conductive layer to a second conductive layer, wherein said identifying layer connections includes identifying that the perimeter of the via is contained within the perimeter of a conductive structure, and wherein said verifying includes verifying the electrical conductivity of any electrically-linked path including the at least one via, wherein said identifying that the perimeter of the via is contained within the perimeter of a conductive structure, further comprises:

generating a line equation for each line segment defining the perimeter of a selected conductive structure;

for each line equation, counting the number of times a line defined by the line equation intersects the containing conductive structure; and determining that the selected conductive structure is contained within the containing conductive structure if each of the lines intersects the perimeter of the containing conductive structure an odd number of times.

14. A method of verifying electrical connectivity of at least a portion of a defective chip design characterized by a plurality of overlapping conductive layers each overlapping conductive layer provided with an associated set of conductive structures disposed thereon, the conductive structures collectively cooperatively defining electrically-linked paths devoid of active electrical devices, capacitors, and inductors, the method comprising:

identifying a location of each conductive structure including the associated layer;

identifying layer connections conductively joining conductive structures on different layers; and verifying, on the basis of the identified locations of each conductive structure and the identified layer connections, electrical connectivity of the electrically-linked paths, wherein each conductive structure has a perimeter, at least one of the perimeters being polygonal, wherein said identifying a location includes defining, for each conductive structure, the perimeter of the conductive structure, and, wherein said verifying includes determining, for each conducive structure, points of intersection between the perimeter of the conductive structure and the perimeter of at least all conductive structures in spatial proximity thereto;

defining, for each perimeter, a set of line segments, said determining points of intersection comprising determining points of intersection between the set of line segments associated with the polygonal perimeter and the set of line segments for each perimeter of at least all conductive structures in spatial proximity, further wherein at least one perimeter is curved, the method further comprising determining an equation for each curved perimeter, and wherein said determining points of intersection further comprises determining, for each curved perimeter, points of intersection between the equation and all other curved perimeters and between the equation and all polygonal perimeters.

15. A computer program for testing electrical connections between conductive structures associated with a chip or chip design, which conductive structures collectively cooperatively define electrically-linked paths devoid of active electrical devices, capacitors, and inductors, the chip or chip design having a plurality of layers, each conductive structure having a perimeter, the chip or chip design including among said conductive structures a plurality of polygonal conductive structures, each polygonal conductive structure being located on a known layer, the computer program residing on a computer-readable medium of a computer, the computer program comprising instructions for causing the computer to:

determine, for each said polygonal conductive structure, a set of line segments defining the perimeter of the polygonal conductive structure;

determine conductive layer connections between each of said plurality of layers;

determine, for each polygonal conductive structure, points of intersection between the set of line segments of that conductive structure and the set of line segments of all other polygonal conductive structures on the chip or chip design; and test electrical connections between selected conductive structures using the layer connections and the points of intersection.

16. A method for finding electrical short circuits on a microchip or microchip design having a plurality of electrically interconnected conductive structures collectively cooperatively defining electrically-linked paths devoid of active electrical devices, capacitors, and inductors, each said conductive structure having a perimeter, the microchip or microchip design having a plurality of layers, the conductive structures including vias between at least some of the layers, the method comprising:

determining a set of vertices along the perimeter for each conductive structure;

determining, for each conductive structure, a set of line segments connecting the vertices of the conductive structure, the set of line segments defining the perimeter of the conductive structure;

determining points of intersection between the set of line segments for each conductive structure to obtain overlapping conductive structures;

locating the vias by determining the conductive structures, if any, that are contained within the set of line segments of another conductive structure;

checking continuity of an electrical path between conductive structures using the points of intersection and the vias.

17. The method of claim 16, wherein the step of determining points of intersection further includes testing each line segment for each conductive structure against all line segments on the microchip or microchip design to determine if the tested line segment intersects any other line segments.

18. A method for testing electrical continuity on a chip or chip design, comprising:

selecting a chip or chip design to be tested, the chip or chip design having a plurality of layers and a plurality of structures, each structure having a perimeter, the structures including a plurality of polygonal structures, each polygonal structure being located on a known layer, the chip or chip design being devoid of active electrical devices, capacitors, and inductors;

determining, for each polygonal structure, a set of line segments defining the perimeter of the polygonal structure;

determining conductive layer connections between each of the plurality of layers;

determining, for each polygonal structure, points of intersection between the set of line segments of that polygonal structure and the set of line segments of all other polygonal structures on the chip or chip design; and testing electrical connections between structures using the conductive layer connections and the points of intersection.

19. A computer program for testing electrical continuity on a microchip or microchip design, the computer program residing on a computer-readable medium of a computer, the computer program comprising instructions for causing the computer to:

recognize a microchip or microchip design to be tested, the microchip or microchip design having a plurality of layers and a plurality of structures, each structure having a perimeter, the structures including a plurality of polygonal structures, each polygonal structure being located on a known layer, the microchip or microchip design being devoid of active electrical devices, capacitors, and inductors;

determine, for each polygonal structure, a set of line segments defining the perimeter of the polygonal structure;

determine conductive layer connections between each of the plurality of layers;

determine, for each polygonal structure, points of intersection between the set of line segments of that polygonal structure and the set of line segments of all other polygonal structures on the microchip or microchip design; and test electrical connections between structures using the conductive layer connections and the points of intersection.

* * * * *